United States Patent

Bigelow et al.

[11] Patent Number: 5,518,766
[45] Date of Patent: May 21, 1996

[54] MULTI-LAYER SUPERHARD FILM STRUCTURE

[75] Inventors: Louis K. Bigelow, Salt Lake City, Utah; Robert M. Frey, Hudson, Mass.; Gordon L. Cann, Laguna Beach, Calif.

[73] Assignee: Norton Company, Worchester, Mass.

[21] Appl. No.: 115,956

[22] Filed: Sep. 2, 1993

Related U.S. Application Data

[62] Division of Ser. No. 810,364, Dec. 18, 1991, Pat. No. 5,310,596, which is a continuation of Ser. No. 565,304, Aug. 10, 1990, abandoned.

[51] Int. Cl.$^6$ .............................. C23C 16/26; B05D 1/38; H05H 1/48
[52] U.S. Cl. .................. 427/255.7; 427/249; 427/577; 427/580
[58] Field of Search .................... 427/424, 577, 427/249, 580, 255.7

[56] References Cited

U.S. PATENT DOCUMENTS

| | | | |
|---|---|---|---|
| 3,661,526 | 5/1972 | Angus et al. | 23/209.1 |
| 4,301,134 | 11/1981 | Strong | 501/86 |
| 4,707,384 | 11/1987 | Schachner et al. | 427/255.7 |
| 4,734,339 | 3/1988 | Schachner et al. | 428/701 |
| 4,836,881 | 6/1989 | Satoh et al. | 501/86 |
| 4,842,937 | 6/1989 | Meyer et al. | 428/408 |
| 4,919,974 | 4/1990 | McCune et al. | 427/122 |
| 4,925,701 | 5/1990 | Janson et al. | 427/99 |
| 4,929,489 | 5/1990 | Dreschhoff et al. | 428/195 |
| 4,958,592 | 9/1990 | Anthony et al. | 427/587 |
| 4,988,421 | 1/1991 | Drawl et al. | 427/202 |
| 5,006,203 | 4/1991 | Purdes | 427/580 |
| 5,017,317 | 5/1991 | Marcus | 264/81 |
| 5,023,109 | 6/1991 | Chin et al. | 427/575 |
| 5,082,359 | 1/1992 | Kirkpatrick | 427/162 |
| 5,114,696 | 5/1992 | Purdes | 423/446 |
| 5,131,941 | 7/1992 | Lemelson | 75/10.19 |
| 5,169,579 | 12/1992 | Marcus et al. | 427/301 |
| 5,242,711 | 9/1993 | DeNatale et al. | 427/122 |
| 5,368,937 | 11/1994 | Itoh | 427/249 |

*Primary Examiner*—Diana Dudash
*Attorney, Agent, or Firm*—Volker R. Ulbrich

[57] ABSTRACT

A multi-layer diamond film is grown by d.c. arc assisted plasma deposition. A series of layers are deposited on each other by periodically back-etching the surface and renucleating during deposition. There may also be deposited a thin layer of non-diamond carbon material between the diamond layers, but no other non-carbon material. Renucleation is controlled by varying the proportion of methane to hydrogen in the feed gases, by temperature cycling of the substrate, or by inducing modal changes in the arc.

13 Claims, 1 Drawing Sheet

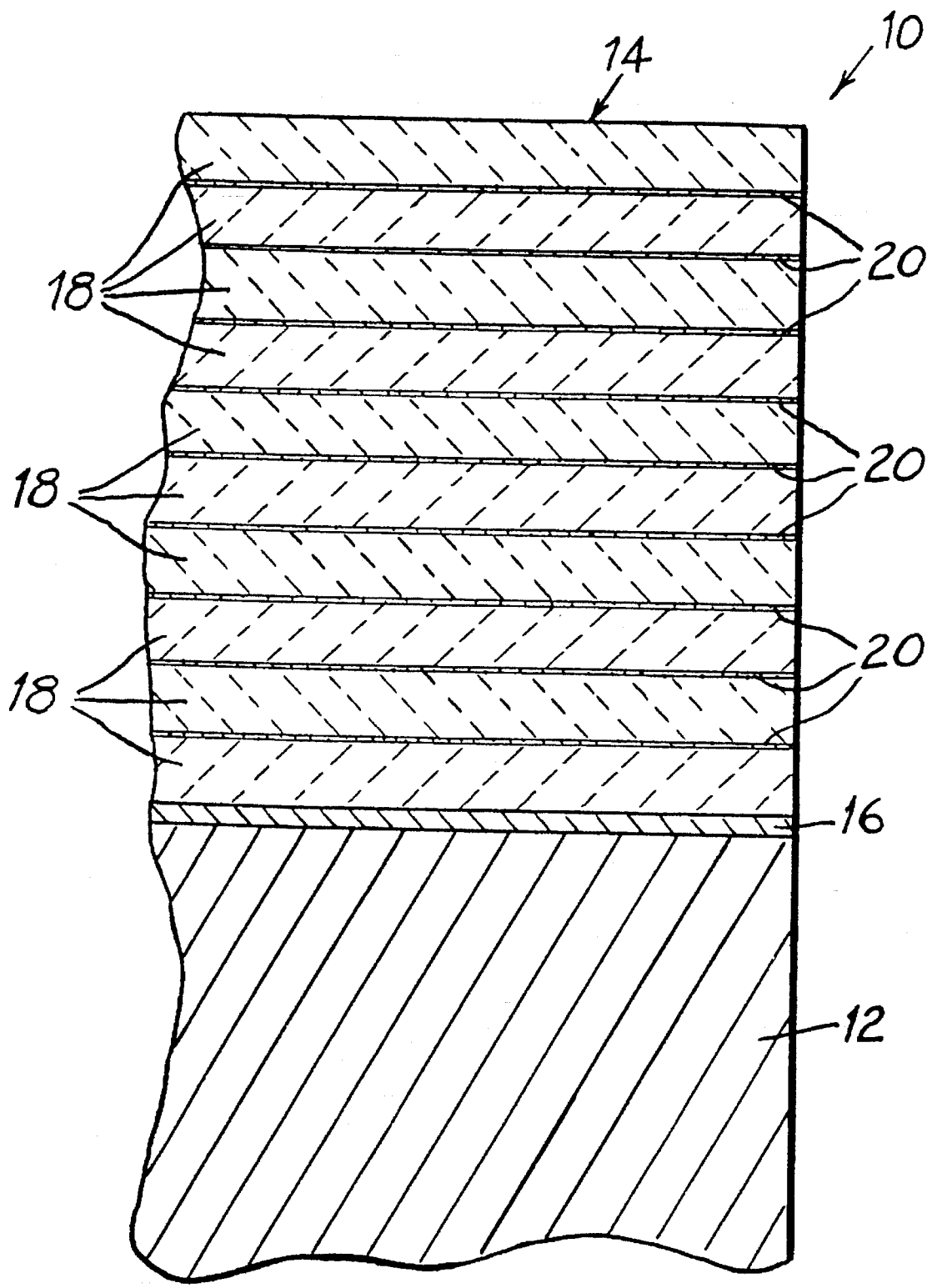

MULTI-LAYER SUPERHARD FILM STRUCTURE

CROSS-REFERENCE TO RELATED APPLICATIONS

This application is a division of application Ser. No. 07/810,364 filed Dec. 18, 1991 and now issued as U.S. Pat. No. 5,310,596, which is a continuation of application U.S. Ser. No. 07/565,304 filed Aug. 10, 1990, now abandoned.

FIELD OF THE INVENTION

The present invention relates to films of superhard material, particularly to diamond made by low pressure film deposition.

BACKGROUND

So-called "superhard" materials include materials such as diamond, cubic boron nitride, and perhaps others having a Knoop hardness of at least 3000 kilograms per square millimeter. Diamond is at the present time the hardest material known.

It is known to grow diamond at temperatures and pressures which are low relative to the so-called "high temperature and pressure" conditions by which synthetic diamond material has been manufactured for some time for industrial use. Several approaches have been successfully used. In each case, it is necessary to provide a substantial amount of energy for dissociating hydrogen molecules to generate hydrogen ions which then assist in the process for growing diamond crystals on a substrate. In the "hot wire" method, an electrically heated resistance wire provides the energy. In the chemical vapor deposition (CVD) method, a microwave plasma provides the energy. In the "arc assisted plasma deposition" method, a direct current (d.c.) arc serves this purpose.

Diamond material may be grown by means of the above methods on selected substrate materials for various purposes. One application of particular interest is the provision of a diamond film at the cutting edge of a cutting tool, such as for machining metal. Diamond far surpasses any other known substance for this purpose, due to its extreme hardness, wear resistance, and high thermal conductivity, coupled with a low coefficient of friction. Typically, a diamond wafer is grown on a substrate and then removed from it as a free-standing structure. The wafer is then cut by a laser into small chips, which are then each bonded at the edge of a respective cutting tool insert for use in conjunction with a cutting tool holder.

One problem with present diamond film material for cutting tools is poor fracture toughness, that being a tendency for the material to suffer bulk fractures, usually leading to a complete failure of a costly tool.

In U.S. Pat. No. 4,734,339 issued Mar. 29, 1988 to Schachner et al it is observed that the adherence of a deposited diamond film to the substrate can be improved by first depositing a thin film of certain metals or carbides, nitrides, or oxides thereof. It is also said that "By interrupting the diamond deposition process with equal intervals and depositing layers of the above mentioned materials a thick coating can be built up, consisting mainly of diamond and having good adhesion to the substrate". The introduction of these foreign materials into the growth process, however, significantly adds to the complexity of the manufacture of diamond film.

SUMMARY OF THE INVENTION

In accordance with the novel method and material of the present invention, a superhard material film is grown as a multilayer film structure with individual layers deposited directly on each other or separated from each other by thin interlayers of material having a chemical composition similar to the superhard material, but having a different morphology. After the deposition of a layer, the layer material may be back-etched to provide renucleation before crystal growth is again established. The resulting film has improved fracture toughness and is therefore well suited for cutting tool applications. Free-standing articles may also be manufactured by this method to alter their mechanical, electrical, or optical properties. The invention applies particularly to diamond grown by arc assisted plasma deposition.

BRIEF DESCRIPTION OF THE DRAWING

The sole figure of the drawings is an exaggerated, elevated perspective, schematic, sectioned view of a fragment of the cutting edge of a cutting tool which includes a diamond film layer in accordance with a preferred embodiment of the present invention.

DETAILED DESCRIPTION

In the embodiment shown in the drawing figure, the cutter element 10 of a cutting tool includes a tungsten carbide substrate 12 to which there is fastened a diamond film chip 14 by means of a layer of braze 16. The diamond film chip 14 is a multi-layer structure of ten microcrystalline diamond layers 18 which are each about 50 microns (micrometers) thick and are separated from each other by thin graphite layers 20 about 2 microns thick.

The braze 16 may be a commercially available active braze product marketed for this purpose, such as that marketed as Lucanex by Lucas Millhaupt, Inc., 5656 So. Pennsylvania Ave., Cudahy, Wis., which is believed to be 70% silver, 28% copper, and 2% titanium by weight.

The diamond film layers 18 are grown by means of a d.c. (direct current) arc plasma vapor deposition apparatus such as is described, for example, in the U.S. Pat. No. 4,682,564 issued Jul. 28, 1987 to G. L. Cann. In this apparatus a stream of hydrogen and methane gas is fed under vacuum conditions of about 5–75 torr into a region in which a magnetically circulated direct current arc has been established to generate a plasma. The high temperature of the plasma causes the methane and hydrogen to dissociate to form atomic hydrogen ions and carbon atoms, together with various other dynamically balanced molecular combinations of these atoms. A cooled molybdenum substrate is placed adjacent the plasma and thereby coated with diamond material. It is an important feature of the present invention that in the course of the diamond deposition, the growth conditions are periodically substantially changed, so that individually identifiable layers of diamond material are formed into a multi-layer structure. Typically, the change in the growth conditions is a discontinuing of the growth and the formation of some non-diamond carbon, after which the non-diamond carbon is back-etched to provide renucleation for the next layer of diamond.

Renucleation can be initiated in more than one manner. A change in the mode of the arc can result in renucleation, as can temperature cycling of the deposition substrate or a change in the proportions of the feed gases present in the system. One change in the mode of the arc for this purpose is a switching between a cylindrical arc and a helical arc, the switching being accomplished by changing the strength of the applied magnetic arc control field. The arc modes are associated with different species

EXAMPLE 1

In one example of a process in accordance with the invention, a molybdenum substrate disc about 6 inches in diameter and 1 inch thick has its central axis reciprocated horizontally by a step motor drive, perpendicularly to the axis, with an excursion of about 1 inch to each side and an acceleration of about nine inches per second per second. It is simultaneously spun about its central axis at about 300 rpm (revolutions per minute). The substrate is placed in a plasma zone of a 25 kw (kilowatt) d.c. arc plasma vapor deposition apparatus of the general type described in the above-mentioned U.S. Pat. No. 4,682,564. The apparatus has an anode-cathode gap of 1 inch, a nozzle diameter of 3 inches, a nozzle length of 4.5 inches, and a nozzle standoff of ⅞ inch. The substrate perimeter temperature is held at 875 degrees Celsius. Other system parameters may be as follows:

| | |
|---|---|
| arc current | 49 amperes |
| arc voltage | −330.6 volts |
| magnet current | 304.3 amperes |
| chamber pressure | 20.02 torr |
| hydrogen flow | 4.6 liters per second |
| methane flow | 21.7 milliliters per second |

The total growth time for the film may be about 40 hours to form an average thickness of about 650 microns. Every four hours, the flow of methane is changed to 95 milliliters per second for ten minutes, whereupon diamond crystallization is disrupted. Thereafter, the methane is shut off entirely for about one hour to back-etch the existing layer of material, which will include surface material of the same chemical composition as the deposited crystal of the main layer, but with a different morphology. In this example, the exposed portion of the layer is graphitic material. Upon back etching with hydrogen, diamond nucleation sites form in the graphitic material. Thereafter, the initial growth conditions are reestablished to result in continued growth of diamond film on the newly nucleated material. A ten layer structure may be considered suitable for cutting tool applications. After deposition is completed, the film is removed from the deposition substrate by allowing the deposition substrate to cool until the diamond film separates from it as a result of differences in thermal expansion characteristics between the film and substrate.

The diamond material of the layers 18 is in the form of pure diamond microcrystals which begin at the bottom of each layer 20 with a relatively small size and grow progressively larger in average size as the thickness of the layer increases. The nature of this process is such that there is a tendency for the microcrystals to grow in vertical columns, which increase in their lateral dimensions as they grow upward. This necessarily means that with increasing thickness there are a decreasing number of intercrystalline bonds between the microcrystals, resulting in a material which is not as well suited for cutting tool applications because of its poor fracture toughness. Fracture occurs when the microcrystal columns become separated from each other by the cutting forces to which they are exposed. It is expected that diamond layers from as thin as a single nanometer to as thick as one millimeter are effective for improving the fracture toughness in a multi-layer structure.

The periodic back-etching and renucleation of the diamond during the growth process affords control of the size of the microcrystalline columns, and thus of the average microcrystal size of the material. This permits the growth of a multi-layer structure which has significantly improved fracture toughness and is therefore particularly well suited for cutting tool applications.

The renucleation process may involve a change in the proportions of methane and hydrogen fed into the system, so that graphitic carbon or perhaps other non-diamond material is deposited briefly instead of diamond. The non-diamond carbon generally includes some material which may become a nucleation site for diamond growth. When the growth conditions for diamond are then reestablished in the system, there is initiated the growth of a new layer of diamond which is separated from the previous one by a thin layer of non-diamond carbon, such as the layers 20 of the structure of the above-described embodiment.

It may be possible to establish renucleation conditions without thereby depositing a significant amount of non-diamond material in the process. Therefore, while in the above embodiment there are graphite layers present, it is thought that their thickness should be minimal, and that it is the presence of multiple diamond layers, rather than of the interposed non-diamond layers, which accounts for the improved fracture toughness of the resulting diamond film structure. It may be most desirable, for example, to simply discontinue diamond growth by appropriately decreasing the ratio of methane-to-hydrogen or shutting off the methane entirely, then back-etching the deposited material to alter somewhat the nucleation sites present at that time, and then restarting growth with the new nucleation sites. Other ways for arresting growth include the introduction of a temperature fluctuation in the plasma or the substrate. It is also contemplated that identifiable layers may be generated by sufficiently varying one or more of the growth conditions during the process to disrupt somewhat the continuity of the crystal growth, without actually stopping growth or introducing a substantial amount of non-diamond material.

The specific substrate material for a cutting tool which makes use of the diamond film of the present invention is for example only. It may also be a different metal or other material, such as a ceramic.

While the diamond film chip 14 of the above embodiment was formed by a d.c. arc plasma deposition process, it is thought that the present invention applies to any superhard material film crystal growth process in which renucleation can be initiated to form a multi-layer structure consisting essentially entirely of a single chemical compound. This would include, however, compounds which may contain a dopant material for some functional purpose, such as thermal or electrical characteristics, but which do not substantially alter the gross mechanical characteristics of the material. Furthermore, the resulting structure also has desirable properties as a free-standing element. The optical properties, such as light transmission characteristics, are influenced by the parameters chosen for the layers. A reduction in the average microcrystal size generally results in a reduction in visible light transmission. Resistance to fracture is also increased. Resistance to wear, on the other hand, is decreased. These properties may be controlled to some extent by the control of microcrystal size which is afforded by the present invention.

While the above discussion has pertained to diamond material, it can be reasonably supposed that the crystallization processes for other superhard materials, such as cubic boron nitride, is likely to have similar characteristics insofar as the toughness for cutting tools which is addressed by the present invention. Therefore, the present invention applies also to such other superhard materials as might be deposited as films.

What is claimed is:

1. A process of depositing a material, comprising:

depositing diamond on a substrate from a feed gas by chemical vapor deposition by establishing crystal growth conditions for the material, and then repeatedly modifying and then returning to the same growth conditions in the course of the depositing to control the size of microcrystals of the film structure to form layers of diamond, each diamond layer comprising diamond crystals of increasing size in a growth direction from a first side of the layer to a second side of that layer.

2. The process according to claim 1, wherein the modifying includes renucleating the crystal growth.

3. The process according to claim 2, wherein the renucleating includes depositing a layer of non-diamond carbon material.

4. The process according to claim 3, wherein the modifying further includes changing the composition of feed gas for the process.

5. The process according to claim 4, wherein the depositing of diamond is by means of plasma deposition.

6. The process according to claim 5, wherein the depositing of diamond is by means of arc-assisted plasma.

7. The process according to claim 6, wherein the feed gas comprises methane and hydrogen.

8. The process according to claim 7, further comprising renucleating by increasing the ratio of methane-to-hydrogen in the feed gas.

9. The process according to claim 8, further comprising, prior to increasing the ratio of methane-to-hydrogen in the feed gas, reducing the ratio of methane-to-hydrogen in the feed gas to result in back-etching of the last-deposited layer.

10. The process according to claim 2, wherein renucleating is initiated by means of a modal change in the configuration of the arc which generates the plasma.

11. The process according to claim 10, wherein the modal change is accomplished by switching between a cylindrical arc mode and a helical arc mode.

12. The process according to claim 11, wherein the switching is accomplished by changing the strength of an axial magnetic field.

13. The process according to claim 3, comprising temperature cycling of the deposition substrate prior to the renucleating.

* * * * *